United States Patent
Yang et al.

(10) Patent No.: US 12,026,346 B2
(45) Date of Patent: Jul. 2, 2024

(54) DISPLAY DEVICE

(71) Applicant: SAMSUNG DISPLAY CO., LTD., Yongin-si (KR)

(72) Inventors: Sung-Jin Yang, Yongin-si (KR); Hyunsik Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/330,821

(22) Filed: Jun. 7, 2023

(65) Prior Publication Data

US 2024/0086020 A1 Mar. 14, 2024

(30) Foreign Application Priority Data

Sep. 8, 2022 (KR) .................. 10-2022-0113996

(51) Int. Cl.
*G06F 3/044* (2006.01)
*H10K 59/80* (2023.01)

(52) U.S. Cl.
CPC .......... *G06F 3/0446* (2019.05); *G06F 3/0443* (2019.05); *H10K 59/8722* (2023.02)

(58) Field of Classification Search
CPC .. G06F 3/0443; G06F 3/0446; H10K 59/8722
See application file for complete search history.

(56) References Cited

U.S. PATENT DOCUMENTS

| | | | |
|---|---|---|---|
| 9,873,276 B2 | 1/2018 | Tarnowski et al. | |
| 2011/0057893 A1 | 3/2011 | Kim et al. | |
| 2020/0409508 A1* | 12/2020 | Kim | G06F 3/0446 |
| 2021/0096694 A1* | 4/2021 | Yang | H10K 59/1201 |
| 2021/0247635 A1 | 8/2021 | Shin et al. | |
| 2021/0326000 A1* | 10/2021 | Yang | G06F 3/04164 |
| 2021/0365147 A1* | 11/2021 | Yang | G06F 3/0446 |

FOREIGN PATENT DOCUMENTS

| | | |
|---|---|---|
| KR | 10-1082293 | 11/2011 |
| KR | 10-2021-0100795 | 8/2021 |

* cited by examiner

*Primary Examiner* — Muhammad N Edun
(74) *Attorney, Agent, or Firm* — F. CHAU & ASSOCIATES, LLC

(57) ABSTRACT

Disclosed is a display device including a signal line and a pad connected to the signal line. The pad includes metal lines disposed on the same layer as the signal line and spaced apart from the signal line on a plane and a transparent conductive oxide pattern disposed on the signal line and the metal lines and electrically connected to the signal line and the metal lines. An opening corresponding to the metal lines is defined in the transparent conductive oxide pattern.

20 Claims, 18 Drawing Sheets

DISPLAY DEVICE

CROSS-REFERENCE TO RELATED APPLICATIONS

This application claims priority under 35 U.S.C. § 119 to Korean Patent Application No. 10-2022-0113996 filed on Sep. 8, 2022, in the Korean Intellectual Property Office, the disclosures of which are incorporated by reference herein in their entireties.

BACKGROUND

Embodiments of the present disclosure described herein relate to a display device, and more particularly, relate to a display device including a pad having a test region.

Various display devices used in multimedia devices, such as a television, a mobile phone, a tablet computer, a car navigation unit, a game machine, and the like, are being developed. The display devices include a keyboard or a mouse as an input device. In addition, the display devices include an input sensor, such as a touch panel, as an input device.

Various defects may occur in a process of manufacturing a display device. A display panel or an input sensor may be tested during the manufacturing process of the display device.

SUMMARY

Embodiments of the present disclosure provide a display device including a pad having reduced contact resistance with a test device.

According to an embodiment, a display device includes a display panel and an input sensor disposed on the display panel. The display panel includes a display substrate, an encapsulation substrate that faces the display substrate, and a sealing member that couples the display substrate and the encapsulation substrate with each other. The input sensor includes a sensing electrode, a signal line connected to the sensing electrode, a pad connected to the signal line, and an insulating layer. The pad includes metal lines disposed on the same layer as the signal line and spaced apart from the signal line on a plane and a transparent conductive oxide pattern disposed on the signal line and the metal lines and electrically connected to the signal line and the metal lines. The transparent conductive oxide pattern includes an opening exposing the metal lines.

The signal line may include the same material as the metal lines.

The metal lines may include a first metal line and a second metal line that crosses the first metal line.

The metal lines may further include a third metal line connected to the first metal line and the second metal line.

The metal lines may have a line width selected from a range of 1 micrometer to 10 micrometers.

The signal line may include a pad portion that overlaps the transparent conductive oxide pattern. The pad portion may have a pad opening exposing the metal lines.

The signal line may include a pad portion that overlaps the transparent conductive oxide pattern. The pad portion may include a base portion, and a first line portion and a second line portion that extend from the base portion. The metal lines may be disposed in a space between the first line portion and the second line portion.

The first line portion may have a line width selected from a range of 1 micrometer to 10 micrometers.

The first line portion and the second line portion may have the same length.

The metal lines may overlap the sealing member.

The transparent conductive oxide pattern may overlap the sealing member.

The insulating layer may include a first insulating layer disposed on the signal line. The first insulating layer includes a first insulating opening disposed under the opening of the transparent conductive oxide pattern.

The transparent conductive oxide pattern may be disposed on the first insulating layer, and the transparent conductive oxide pattern may be connected to the signal line through a first contact hole that penetrates the first insulating layer and is connected to the metal lines through a second contact hole that penetrates the first insulating layer.

The insulating layer may further include a second insulting layer disposed on the first insulating layer.

The second insulating layer may have a second opening and a third opening defined therein. The second opening may be connected to the first opening, and the third opening may expose a portion of the transparent conductive oxide pattern.

The first opening and the second insulating may be aligned with each other.

The second opening and the third opening may be arranged in an extension direction of the transparent conductive oxide pattern.

The sensing electrode may include a first sensing electrode that extends in a first direction and a second sensing electrode that extends in a second direction crossing the first direction. One of the first sensing electrode and the second sensing electrode may include an electrode pattern disposed on a layer different from the signal line and a conductive pattern disposed on the same layer as the signal line and connected to the electrode pattern.

The other one of the first sensing electrode and the second sensing electrode may include the same material as the transparent conductive oxide pattern and may be disposed on the same layer as the transparent conductive oxide pattern.

According to an embodiment, a display device includes a display panel that includes a lower glass substrate, an upper glass substrate, and a frit that couples the lower glass substrate to the upper glass substrate, and an input sensor disposed on an upper surface of the upper glass substrate. The input sensor includes a sensing electrode, a signal line connected to the sensing electrode, and a pad connected to the signal line. The pad includes a metal line that is disposed on the same layer as the signal line and spaced apart from the signal line on a plane and that overlaps the frit and a transparent conductive oxide pattern that is disposed on the signal line and the metal line and electrically connected to the signal line and the metal line and that overlaps the frit. The transparent conductive oxide pattern includes an opening exposing the metal line.

According to an embodiment, a display device includes a base substrate, a signal line disposed on the base substrate, an insulating layer that covers the signal line, and a pad connected to the signal line. The pad includes a metal pattern disposed on the same layer as the signal line and spaced apart from the signal line on a plane and a transparent conductive oxide pattern disposed on the insulating layer and electrically connected to the signal line and the metal pattern through contact holes that penetrate the insulating layer. The transparent conductive oxide pattern includes a first opening exposing the metal pattern, and the insulating layer includes a second opening exposing the metal pattern.

The first opening is greater than the second opening. A portion of the insulating layer partially fills the first opening and contacts an inner surface of the first opening.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1A:
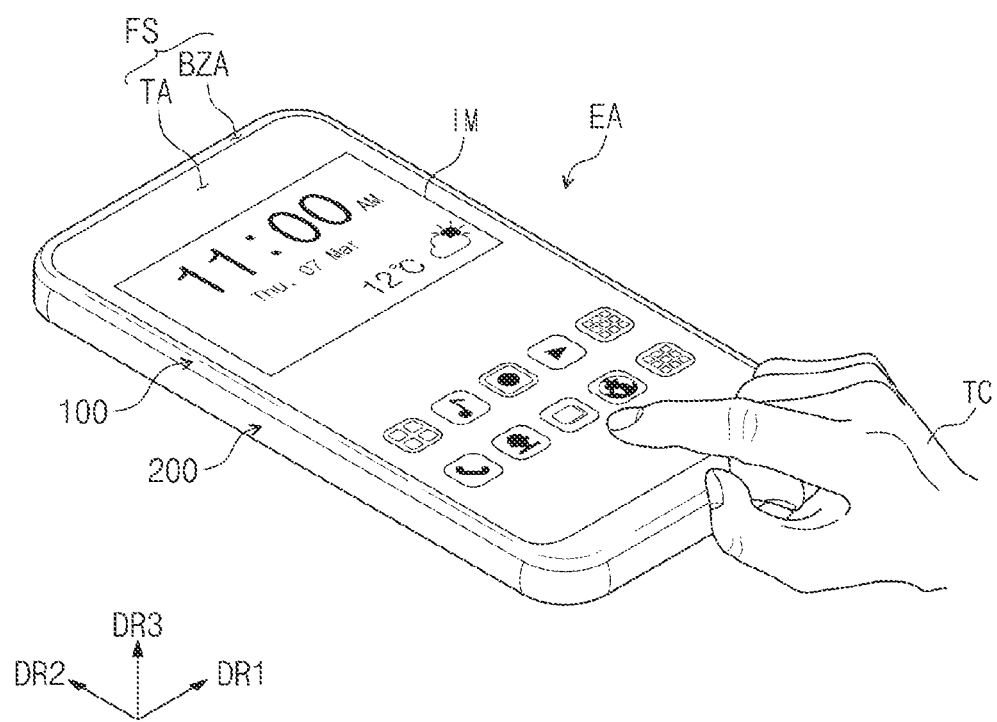
FIG. 1A is a perspective view of an electronic device according to an embodiment of the present disclosure.

In this specification, when it is mentioned that a component (or, a region, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the present disclosure will be described with reference to the accompanying drawings.

Figure 1B:
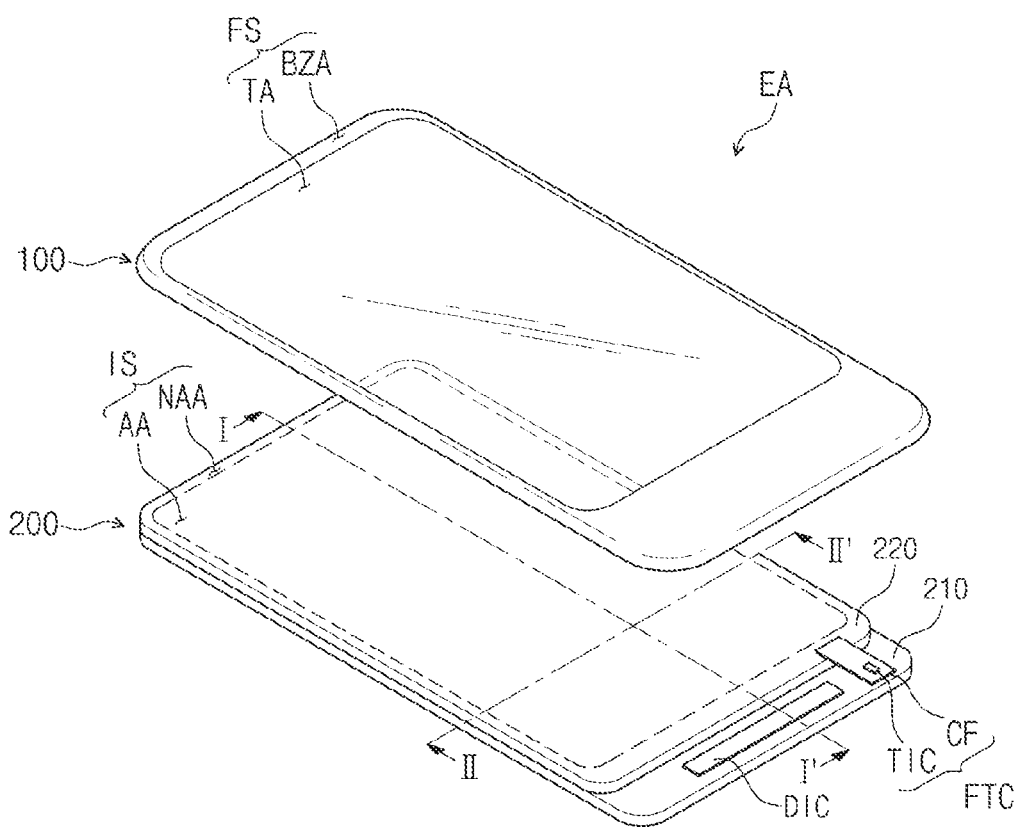
FIG. 1B is an exploded perspective view of the electronic device illustrated in FIG. 1A according to an embodiment of the present disclosure.
Figure 1C:
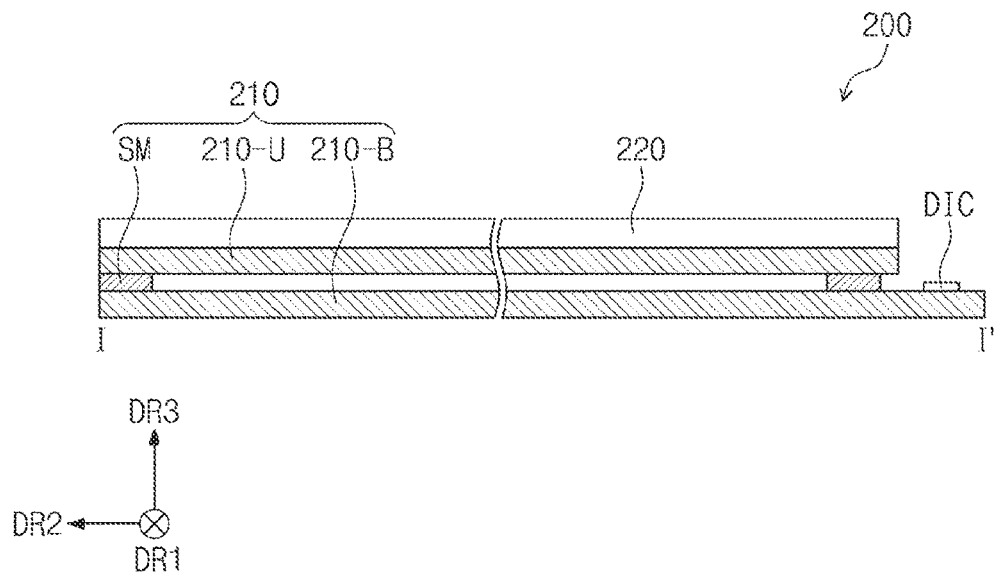
FIG. 1C is a sectional view of a display device taken along line I-I' of FIG. 1B according to an embodiment of the present disclosure.
Figure 1D:
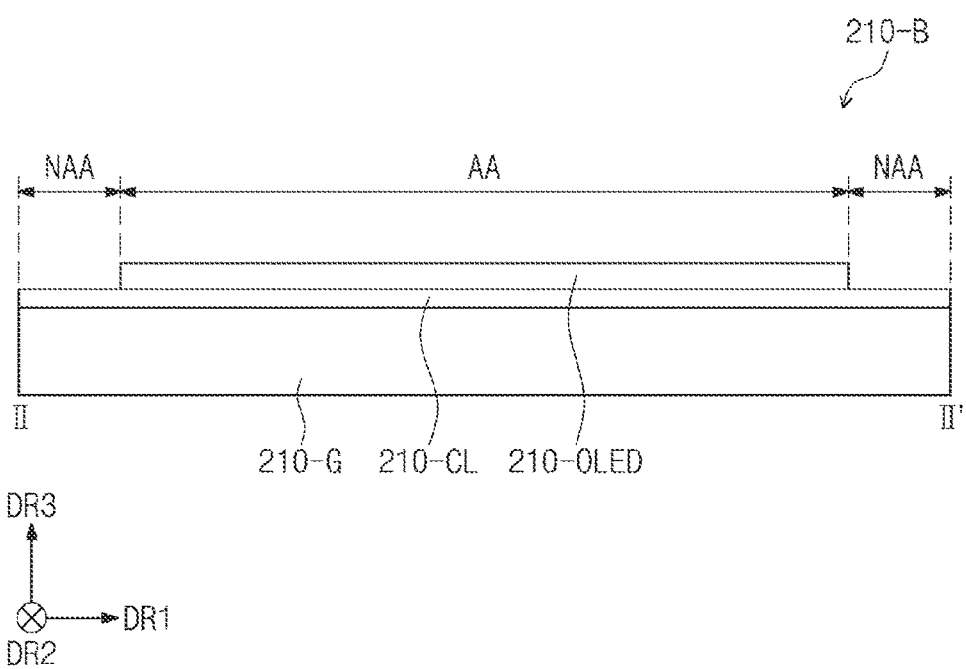
FIG. 1D is a sectional view of a display substrate taken along line II-IF of FIG. 1B according to an embodiment of the present disclosure.

FIG. 1A is a perspective view of an electronic device EA according to an embodiment of the present disclosure. FIG. 1B is an exploded perspective view of the electronic device EA illustrated in FIG. 1A. FIG. 1C is a sectional view taken along line I-I' of FIG. 1B. FIG. 1D is a sectional view of a display substrate taken along line II-IF of FIG. 1B. Hereinafter, the electronic device EA according to this embodiment will be described with reference to FIGS. 1A to 1D.

Referring to FIG. 1A, the electronic device EA may be a device activated in response to an electrical signal. The electronic device ED may include various embodiments. For example, the electronic device EA may include a tablet computer, a notebook computer, a computer, a smart television, or the like. In this embodiment, the electronic device EA is illustrated as a smart phone.

The electronic device EA may display an image IM through a display surface FS. The display surface FS is parallel to a plane defined by a first direction DR1 and a second direction DR2. The normal direction of the display surface FS, that is, the thickness direction of the electronic device EA is indicated by a third direction DR3. Front surfaces (or, upper surfaces) and rear surfaces (or, lower surfaces) of members or units to be described below are distinguished from each other based on the third direction DR3. Hereinafter, the first to third directions DR1, DR2, and DR3 are defined as directions indicated by first to third directional axes, respectively, and the first to third directional axes are denoted by the same reference numerals as those of the first to third directions DR1, DR2, and DR3.

The display surface FS on which the image IM is displayed may correspond to a front surface of the electronic device EA and may correspond to a front surface FS of a window member 100. Hereinafter, the display surface (or, the front surface) of the electronic device EA and the front surface of the window member 100 are denoted by the same reference numeral. In FIG. 1A, a clock widget and a plurality of icons are illustrated as an example of the image IM.

Referring to FIG. 1B, the electronic device EA includes the window member 100 and a display device 200. Although not separately illustrated, the electronic device EA may further include an optical member disposed between the window member 100 and the display device 200. The optical member may include a polarizer. The optical member may include a color filter member that lowers the reflectivity of external light.

The window member 100 includes a base panel. For example, the base panel may be implemented with glass, plastic, or a combination thereof. The front surface FS of the window member 100 includes a transmissive region TA and a bezel region BZA. The transmissive region TA may be an optically transparent region. For example, the transmissive region TA may be a region having a visible light transmittance of about 90% or more. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The bezel region BZA may be a region having a lower light transmittance than the transmissive region TA. The bezel region BZA defines the shape of the transmissive region TA. The bezel region BZA may be adjacent to the transmissive region TA and may surround the transmissive region TA. The window member 100 may include a light blocking pattern that is disposed on the base panel and that defines the bezel region BZA.

The bezel region BZA may have a predetermined color. The bezel region BZA may cover a peripheral region NAA of the display device 200 and may interrupt visibility of the peripheral region NAA from the outside. Meanwhile, this is illustrative, and in the window member 100 according to an embodiment of the present disclosure, the bezel region BZA may be omitted.

The display device 200 may generate the image IM (refer to FIG. 1A) and may detect an external input TC (refer to FIG. 1A). A front surface IS of the display device 200 includes an active region AA and the peripheral region NAA. The active region AA may be a region activated in response to an electrical signal.

In this embodiment, the active region AA may be a region where the image IM is displayed and may be a region where the external input TC is sensed. For example, in the active region AA, the external input TC may be sensed during a time when the image IM is displayed. The active region AA corresponds to the transmissive region TA, and the peripheral region NAA corresponds to the bezel region BZA. The expression "a region/portion corresponds to a region/portion" used herein means that "the regions/portions overlap each other", but is not necessarily limited to having the same area and/or the same shape.

Referring to FIG. 1C, the display device 200 includes a display panel 210, an input sensor 220, a drive circuit DIC, and a circuit module FTC.

The display panel 210 may be an organic light emitting display panel or an inorganic light emitting display panel. The panels are distinguished from each other based on constituent materials of light emitting elements. An emissive layer of the organic light emitting display panel may include an organic light emitting material. An emissive layer of the inorganic light emitting display panel may include quantum dots and/or quantum rods. Hereinafter, the display panel 210 will be described as an organic light emitting display panel.

The input sensor 220 senses an external input (e.g., a touch event) applied from the outside. In this embodiment, the input sensor 220 may be a capacitive touch sensor and is not particularly limited.

The drive circuit DIC is disposed on the display panel 210. The drive circuit DIC may be mounted on the display panel 210. The drive circuit DIC is electrically connected to the display panel 210 and provides, to the display panel 210, an electrical signal for driving the display panel 210.

The circuit module FTC is electrically connected to the input sensor 220. In this embodiment, the circuit module FTC may include a flexible circuit board CF and a sensor drive circuit TIC. The flexible circuit board CF includes an insulating layer and a plurality of lines. The lines electrically connect the input sensor 220 to the sensor drive circuit TIC. The sensor drive circuit TIC may be mounted on the flexible circuit board CF in a chip-on film form.

The circuit module FTC may connect the input sensor 220 to the display panel 210. The sensor drive circuit TIC may be omitted. The sensor drive circuit TIC and the drive circuit DIC may be integrated.

Referring to FIG. 1C, the display panel 210 includes the display substrate 210-B, an encapsulation substrate 210-U, and a sealing member SM. The display substrate 210-B and the encapsulation substrate 210-U may be bonded together using the sealing member SM disposed therebetween. The display substrate 210-B includes pixels that generate an image. The encapsulation substrate 210-U seals the pixels and prevents damage to the pixels due to external moisture and oxygen.

The drive circuit DIC may be coupled to the display substrate 210-B. The drive circuit DIC may be provided in the form of an integrated circuit. However, the present inventive concept is not limited thereto. In an embodiment, the drive circuit DIC may be mounted on a circuit board connected to the display substrate 210-B, instead of being mounted on the display substrate 210-B.

The display substrate 210-B and the encapsulation substrate 210-U may include a glass substrate as a base substrate. The display substrate 210-B may have a larger area than the encapsulation substrate 210-U. The drive circuit DIC may be disposed on a partial region of the display substrate 210-B exposed from the encapsulation substrate 210-U. However, without being limited thereto, the display substrate 210-B and the encapsulation substrate 210-U may have substantially the same shape in an embodiment of the present disclosure.

The sealing member SM may include, for example, a frit. The frit is a ceramic adhesive material and has a property of being cured after exposure. The frit may include 15 wt % to 40 wt % of $V_2O_5$, 10 wt % to 30 wt % of $TeO_2$, 1 wt % to 15 wt % of $P_2O_5$, 1 wt % to 15 wt % of BaO, 1 wt % to 20 wt % of ZnO, 5 wt % to 30 wt % of $ZrO_2$, 5 wt % to 20 wt % of $WO_3$, and 1 wt % to 15 wt % of BaO as main ingredients and may include at least one of $Fe_2O_3$, CuO, MnO, $AL_2O_3$, $Na_2O$, and $Nb_2O_5$ as an additive. The sealing member SM overlaps the peripheral region NAA.

Referring to FIG. 1D, the display substrate 210-B includes a base substrate 210-G, a circuit element layer 210-CL disposed on the base substrate 210-G, and a display element layer 210-OLED disposed on the circuit element layer 210-CL. The display substrate 210-B may further include an insulating layer that covers the display element layer 210-OLED.

The base substrate 210-G may include a glass substrate, a metal substrate, or an organic/inorganic composite substrate. The circuit element layer 210-CL includes at least one insulating layer and a circuit element. The insulating layer includes at least one inorganic layer and at least one organic layer. The circuit element includes signal lines and a pixel drive circuit. The display element layer 210-OLED includes organic light emitting diodes as light emitting elements. The display element layer 210-OLED may further include an organic layer such as a pixel defining film.

FIGS. 2A to 2D are sectional views illustrating a manufacturing method of the display device 200 according to an embodiment of the present disclosure.

Figure 2A:
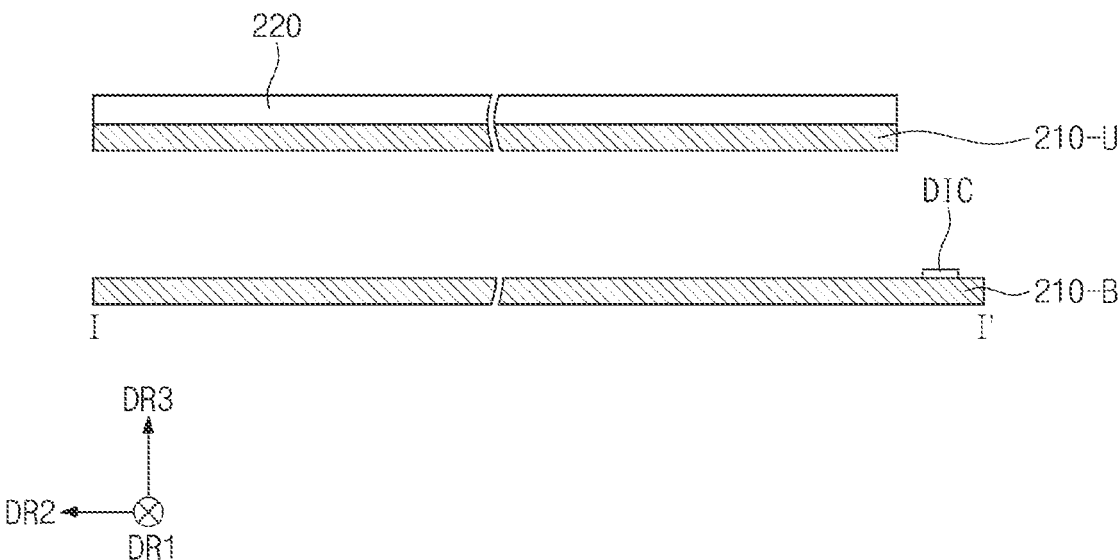
FIGS. 2A to 2D are sectional views illustrating a manufacturing method of the display device according to an embodiment of the present disclosure.

First, as illustrated in FIG. 2A, the display substrate 210-B and the input sensor 220 are prepared. Although the display substrate 210-B having the drive circuit DIC mounted thereon is illustrated as an example, the present disclosure is not necessarily limited thereto. The drive circuit DIC may be mounted on the display substrate 210-B in a subsequent step. The encapsulation substrate 210-U may be a base substrate of the input sensor 220. The input sensor 220 is formed on one surface of the encapsulation substrate 210-U.

Figure 2B:
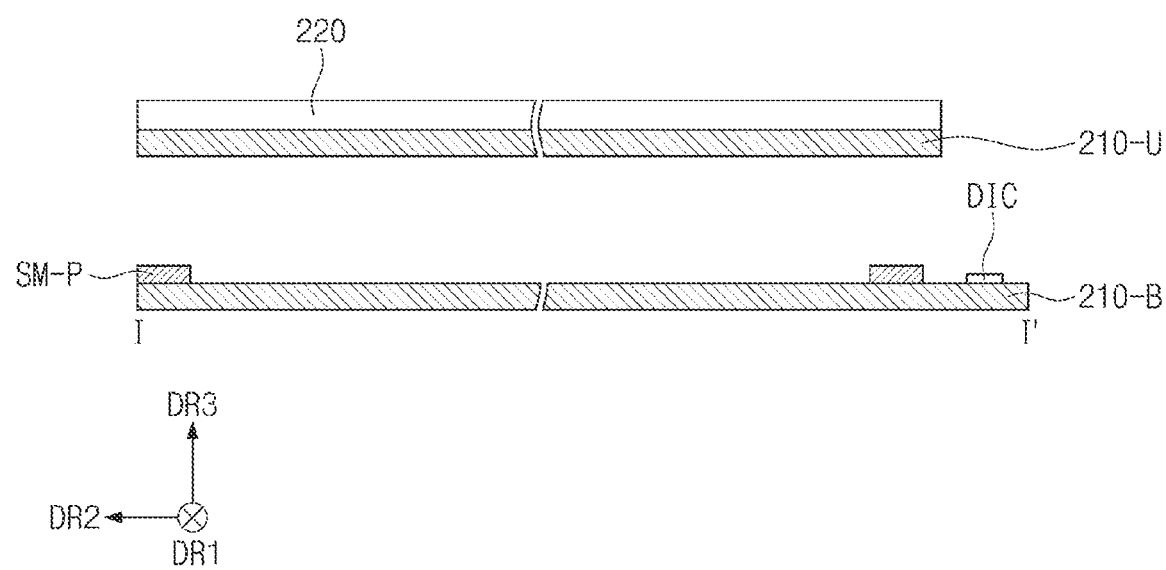

As illustrated in FIG. 2B, a sealing composition DM-P is provided between the display substrate 210-B and the encapsulation substrate 210-U. The sealing composition SM-P is provided on a peripheral region NAA of the circuit element layer 210-CL illustrated in FIG. 1D. Thereafter, the encapsulation substrate 210-U is aligned on the display substrate 210-B. One surface of the encapsulation substrate 210-U on which the input sensor 220 is not disposed may face the sealing composition SM-P.

Figure 2C:
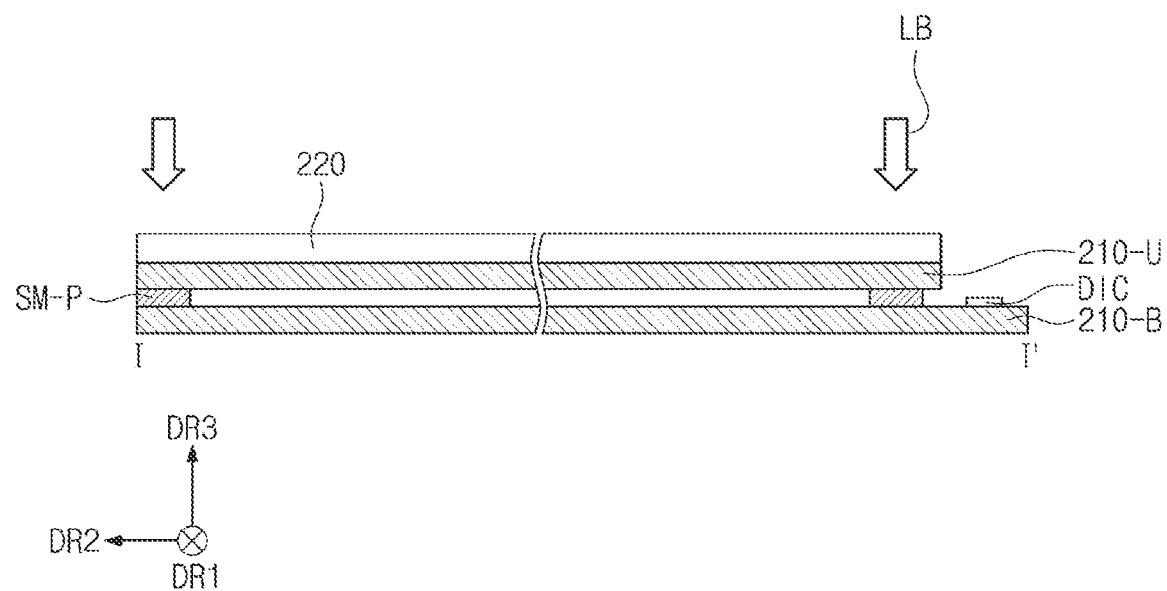

As illustrated in FIG. 2C, a laser beam LB is applied to the sealing composition SM-P from above the input sensor 220. The sealing composition SM-P may include a frit composition. The sealing composition SM-P exposed by the laser beam LB is cured. In some embodiment, the sealing composition SM-P may include or may be formed of resin which is heated and cured by the laser beam LB.

Figure 2D:
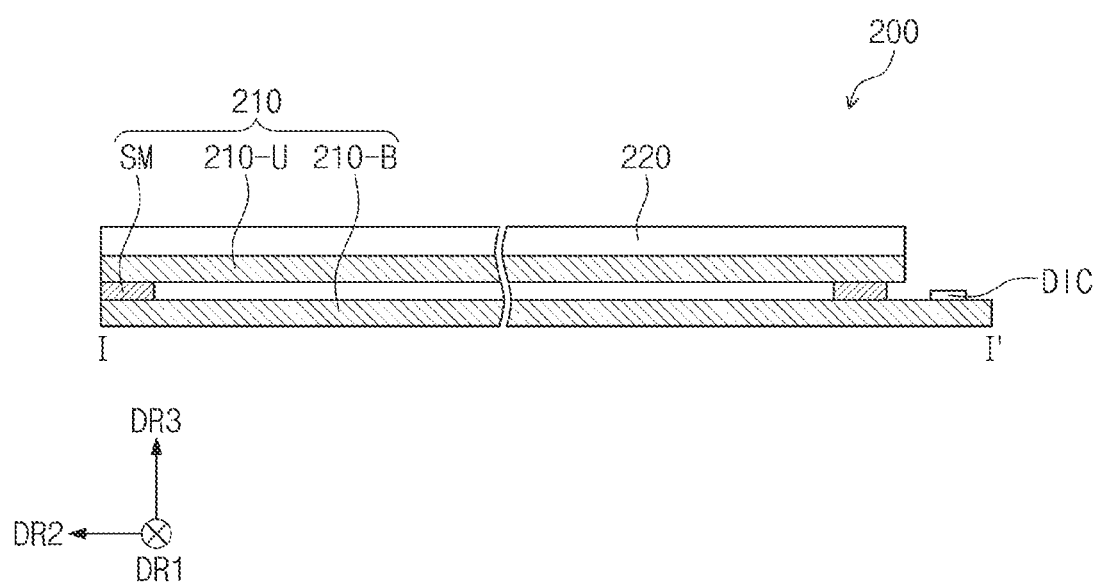

As illustrated in FIG. 2D, the cured sealing composition SM-P forms the sealing member SM. The encapsulation substrate 210-U seals the display element layer 210-OLED of FIG. 1D and protects the organic light emitting diodes from external moisture and oxygen.

Figure 3:
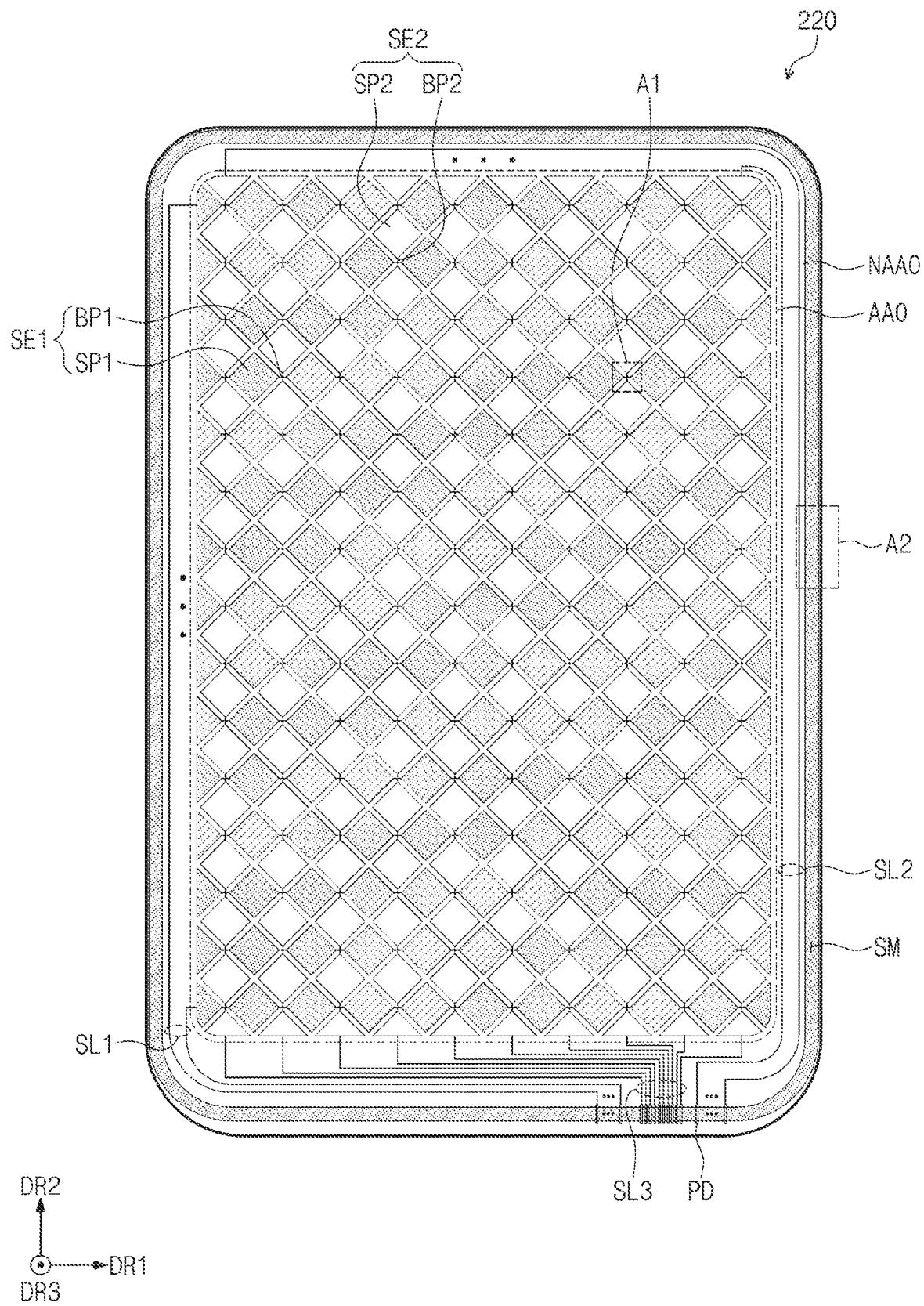
FIG. 3 is a plan view of an input sensor according to an embodiment of the present disclosure.

FIG. 3 is a plan view of the input sensor 220 according to an embodiment of the present disclosure. A sensing region AA0 and a non-sensing region NAA0 of the input sensor 220 that correspond to the active region AA and the peripheral region NAA of the display panel 210 of FIG. 1B are illustrated in FIG. 3. The sensing region AA0 and the non-sensing region NAA0 are defined on an upper surface of the encapsulation substrate 210-U of FIGS. 1B and 1C.

The input sensor 220 may include a plurality of sensing electrodes SE1 and SE2 and a plurality of signal lines SL1, SL2, and SL3 connected to the plurality of sensing electrodes SE1 and SE2. The sensing electrodes SE1 and SE2 are disposed in the sensing region AA0. The sensing electrodes SE1 and SE2 may include the plurality of first sensing electrodes SE1 and the plurality of second sensing electrodes SE2 crossing each other. The first sensing electrodes SE1 may extend in the first direction DR1 and may be arranged in the second direction DR2. Each of the first sensing electrodes SE1 may include a plurality of first sensing portions SP1 and a plurality of first intermediate portions BP1 arranged in the first direction DR1.

In an embodiment of the present disclosure, the input sensor 220 may include only one type of sensing electrodes (i.e., sensing electrodes of the same type). The input sensor 220 may sense an external input by a self-capacitance method.

The second sensing electrodes SE2 may extend in the second direction DR2 and may be arranged in the first direction DR1. Each of the second sensing electrodes SE2 may include a plurality of second sensing portions SP2 and a plurality of second intermediate portions BP2 arranged in the second direction DR2.

The signal lines SL1, SL2, and SL3 are disposed in the non-sensing region NAA0. The signal lines SL1, SL2, and SL3 include the plurality of first signal lines SL1, the plurality of second signal lines SL2, and the plurality of third signal lines SL3. Pads PD are connected to ends of the respective signal lines SL1, SL2, and SL3. As illustrated in FIG. 3, the pads PD may be aligned along a straight line extending in the first direction DR1.

Each of the first signal lines SL1 is connected to one end of a corresponding one of the first sensing electrodes SE1. Each of the second signal lines SL2 is connected to one end of a corresponding one of the second sensing electrodes SE2. Each of the third signal lines SL3 is connected to an opposite end of a corresponding one of the second sensing electrodes SE2. A connection relationship between the sensing electrodes SE1 and SE2 and the signal lines SL1, SL2, and SL3 is not necessarily limited thereto. According to an embodiment of the present disclosure, the second signal lines SL2 may be omitted, or the third signal lines SL3 may be omitted. According to an embodiment of the present disclosure, the input sensor 220 may further include signal lines, each of which is connected to an opposite end of a corresponding one of the first sensing electrodes SE1. In this case, one of the second signal lines SL2 and the third signal lines SL3 may be omitted.

Referring to FIG. 3, the sealing member SM overlapping the non-sensing region NAA0 is illustrated. Most of the sealing member SM is disposed outward of the signal lines SL1, SL2, and SL3 on the plane. For example, when viewed in a plan view, the sealing member SM may be disposed in a region outside where the signal lines SL1, SL2, and SL3 extend along an edge of the encapsulation substrate 210-U. To decrease the area of the non-sensing region NAA0, the sealing member SM may overlap the pads PD.

Figure 4A:
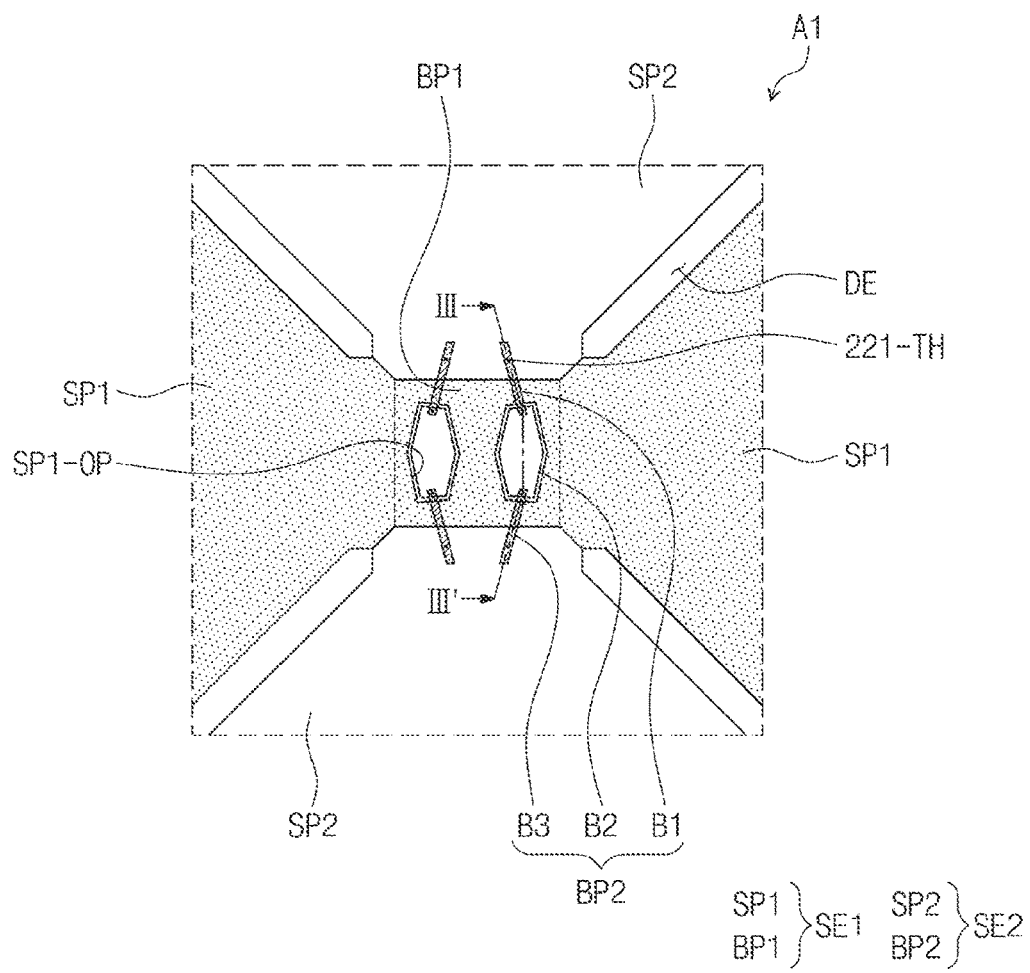
FIG. 4A is a plan view of a first region of FIG. 3 according to an embodiment of the present disclosure.
Figure 4B:
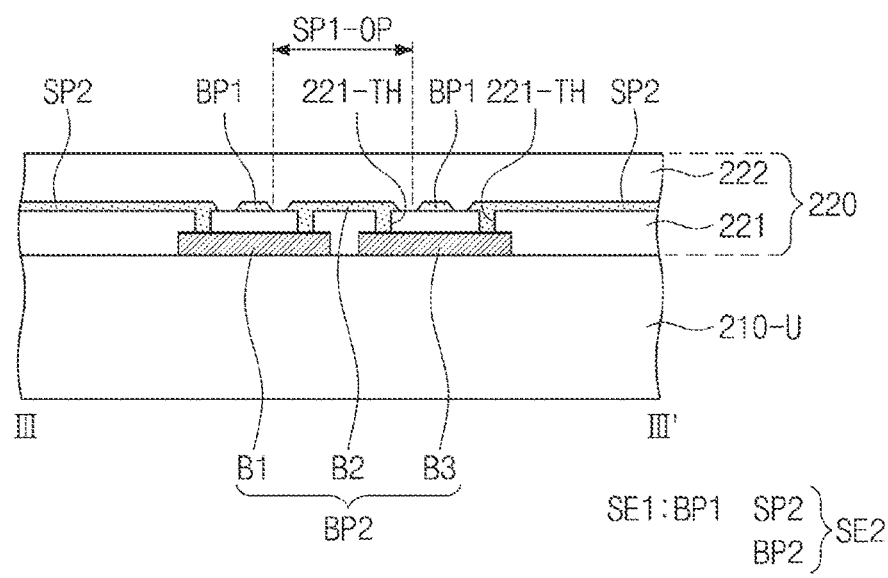
FIG. 4B is a sectional view taken along line of FIG. 4A according to an embodiment of the present disclosure.

FIG. 4A is a plan view of a first region A1 of FIG. 3. FIG. 4B is a sectional view taken along line III-III' of FIG. 4A. Hereinafter, the input sensor 220 will be described in detail with reference to FIGS. 4A and 4B together with FIG. 3.

As illustrated in FIGS. 4A and 4B, the first region A1 corresponds to an intersection region of the first sensing electrode SE1 and the second sensing electrode SE2. The first intermediate portion BP1 and the second intermediate portion BP2 are disposed in the intersection region. The first sensing portions SP1 and the first intermediate portion BP1 may be integrally formed as in this embodiment. However, the present disclosure is not necessarily limited thereto. In an embodiment of the present disclosure, the second sensing portions SP2 and the second intermediate portion BP2 may be integrally formed.

Dummy electrodes DE may be disposed between the first sensing portions SP1 and the second sensing portions SP2. The dummy electrodes DE may be electrically isolated floating patterns. In an embodiment of the present disclosure, the dummy electrodes DE may be omitted. The first sensing portions SP1, the second sensing portions SP2, and the dummy electrodes DE are spaced apart from each other.

The second sensing portions SP2 and the second intermediate portion BP2 that do not have an integrated shape may be defined as electrode patterns and a bridge pattern. That is, in this embodiment, each of the second sensing electrodes SE2 includes the electrode patterns SP2 and the bridge patterns BP2. Although two bridge patterns BP2 disposed in one intersection region are illustrated as an example, the number of bridge patterns is not particularly limited.

In this embodiment, the bridge pattern BP2 may include a first portion B1, a second portion B2, and a third portion B3. Each of the first portion B1, the second portion B2, and the third portion B3 may be a conductive pattern. The second portion B2 is disposed on a layer different from the first portion B1 and the third portion B3. The second portion B2 may be disposed on the same layer as the electrode patterns SP2.

As illustrated in FIG. 4B, the first portion B1 and the third portion B3 are disposed on the encapsulation substrate 210-U. The first portion B1 and the third portion B3 may include metal. The first portion B1 and the third portion B3 may include titanium (Ti), aluminum (Al), copper (Cu), gold (Au), or silver (Ag). Each of the first portion B1 and the third portion B3 may include multiple metal layers. Metal patterns disposed on the encapsulation substrate 210-U may be formed from a meal layer through a photolithography process. An inorganic layer may be additionally disposed on the encapsulation substrate 210-U, and the first portion B1 and the third portion B3 may be disposed on the inorganic layer.

A first insulating layer 221 is disposed on the upper surface of the encapsulation substrate 210-U. The first sensing electrode SE1, the electrode patterns SP2, and the second portion B2 are disposed on the first insulating layer 221. The first intermediate portion BP1 has an opening SP1-OP defined therein in which the second portion B2 is disposed. The electrode patterns SP2 and the second portion B2 may be connected to the first portion B1 and the third portion B3 through contact holes 221-TH penetrating the first insulating layer 221.

The first sensing electrode SE1, the electrode patterns SP2, and the second portion B2 of FIGS. 4A and 4B may include the same material. The first sensing electrode SE1, the electrode patterns SP2, and the second portions B2 may include transparent conductive oxide (TCO). The first sensing electrode SE1, the electrode patterns SP2, and the second portion B2 may include indium tin oxide (ITO), indium zinc oxide (IZO), zinc oxide (ZnO), or indium tin zinc oxide (ITZO). In addition, the first sensing electrode SE1, the electrode patterns SP2, and the second portion B2 may include PEDOT, a metal nano wire, or graphene.

A second insulating layer 222 is disposed on the first insulating layer 221. The second insulating layer 222 may cover the first sensing electrode SE1, the electrode patterns SP2, and the second portion B2. The first insulating layer 221 and the second insulating layer 222 may include an inorganic material or an organic material.

Figure 5A:
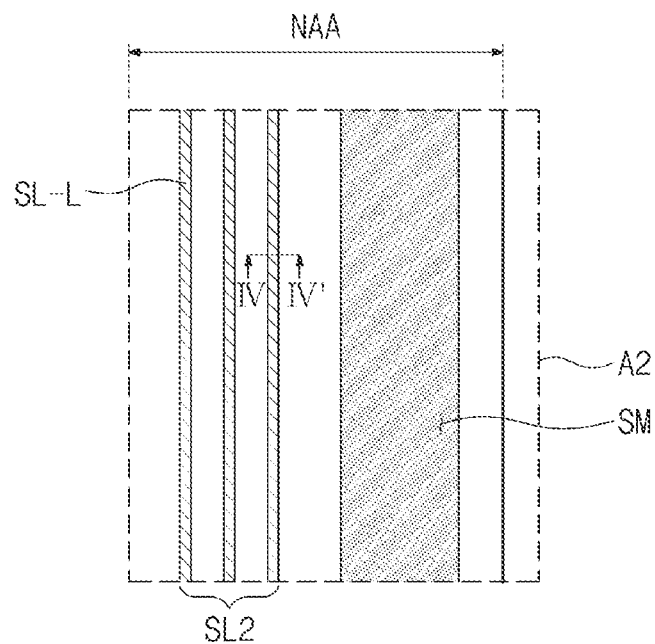
FIG. 5A is a plan view of a second region of FIG. 3 according to an embodiment of the present disclosure.
Figure 5B:
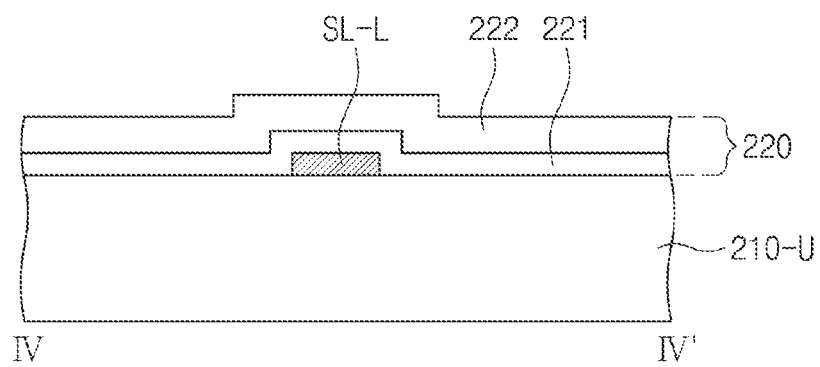
FIG. 5B is a sectional view taken along line IV-IV' of FIG. 5A according to an embodiment of the present disclosure.
Figure 6A:
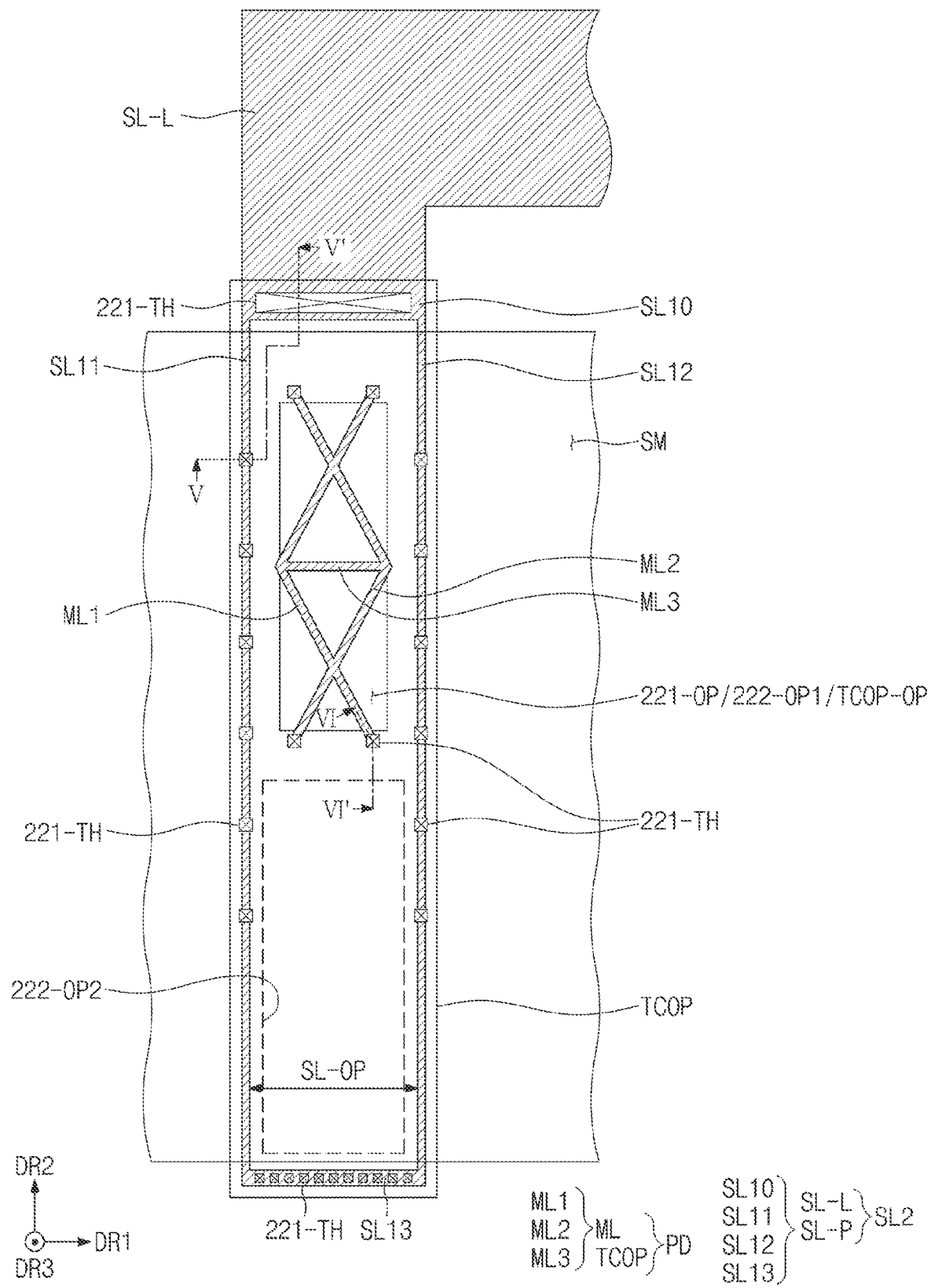
FIG. 6A is a plan view of one signal line and a pad connected thereto that are illustrated in FIG. 3.
Figure 6B:
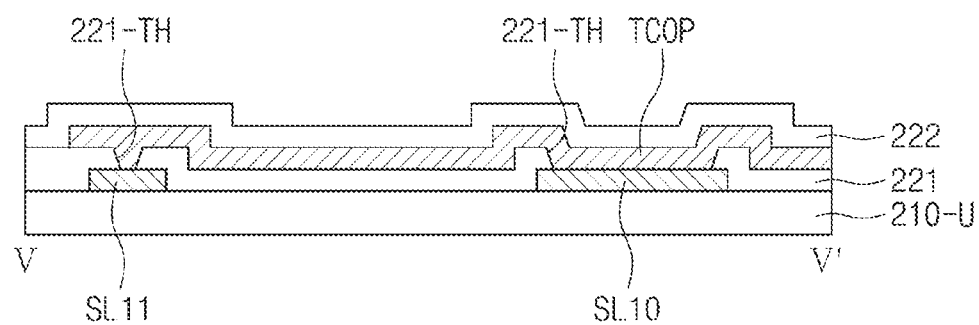
FIG. 6B is a sectional view taken along line V-V' of FIG. 6A according to an embodiment of the present disclosure.
Figure 6C:
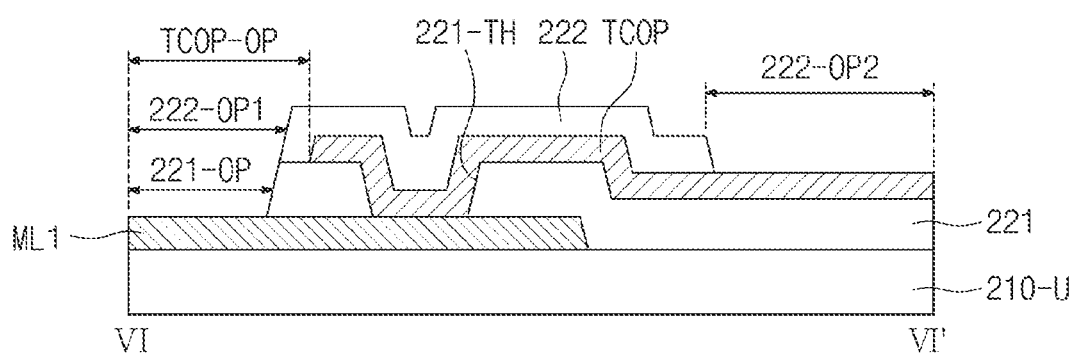
FIG. 6C is a sectional view taken along line VI-VI' of FIG. 6A according to an embodiment of the present disclosure.

FIG. 5A is a plan view of a second region A2 of FIG. 3. FIG. 5B is a sectional view taken along line IV-IV' of FIG. 5A. FIG. 6A is a plan view of one signal line SL2 and a pad PD connected thereto that are illustrated in FIG. 3. FIG. 6B is a sectional view taken along line V-V' of FIG. 6A. FIG. 6C is a sectional view taken along line VI-VI' of FIG. 6A.

In FIGS. 5A to 6C, the second signal line SL2 representing the plurality of signal lines SL1, SL2, and SL3 is illustrated. Description of the second signal line SL2 may be identically applied to the first and third signal lines SL1 and SL3.

Referring to FIGS. 5A and 5B, the second signal line SL2 may be disposed on the encapsulation substrate 210-U and may be disposed under the first insulating layer 221. The second signal line SL2 may be formed through the same photolithography process as the first portion B1 and the third portion B3 described with reference to FIGS. 4A and 4B. The second signal line SL2 may include the same material as the first portion B1 and the third portion B3 and may have the same stacked structure as the first portion B1 and the third portion B3.

Referring to FIGS. 5A to 6A, the second signal line SL2 may include a line portion SL-L and a pad portion SL-P. Distinction of the line portion SL-L and the pad portion SL-P may be defined as an arrangement relationship between the second signal line and the pad PD. A portion of the second signal line SL2 that overlaps the pad PD may be defined as the pad portion SL-P. A portion of the second signal line SL2 that does not overlap the pad PD may be defined as the line portion SL-L.

Referring to FIG. 6A, the pad portion SL-P may provide an opening SL-OP (i.e., a pad opening). In the curing process of the sealing composition SM-P described with reference to FIG. 2C, the laser beam may be applied to the sealing composition SM-P through the opening SL-OP. If the opening SL-OP is not formed in the pad portion SL-P, a laser beam is reflected from the pad portion SL-P, and thus a defect in that the sealing composition SM-P is not sufficiently cured may occur.

The pad portion SL-P may include a base portion SL10, a first line portion SL11, a second line portion SL12, and a connecting portion SL13. The base portion SL10, the first line portion SL11, the second line portion SL12, and the connecting portion SL13 may define the opening SL-OP. The first line portion SL11 and the second line portion SL12 extend from the base portion SL10 in the second direction DR2. The first line portion SL11 and the second line portion SL12 may have the same length.

The connecting portion SL13 extends from an end of the first line portion SL11 to an end of the second line portion SL12 in the first direction DR1. The distance between the first line portion SL11 and the second line portion SL12 may be a distance selected from a range of from 50 micrometers to 200 micrometers. The first line portion SL11 and the second line portion SL12 may have a length selected from a range of 500 micrometers to 1000 micrometers in the second direction DR2. The first line portion SL11 and the second line portion SL12 may have a line width selected from a range of 1 micrometer to 10 micrometers.

Referring to FIG. 6A, the pad PD includes metal lines ML and a transparent conductive oxide pattern TCOP. The metal lines ML are disposed on the same layer as the second signal line SL2. The metal lines ML are spaced apart from the second signal line SL2 on the plane. The metal lines ML are disposed between the first line portion SL11 and the second line portion SL12.

The transparent conductive oxide pattern TCOP is disposed on a layer different from the metal lines ML. As illustrated in FIG. 6B, the first line portion SL11 is disposed under the first insulating layer 221, and the transparent conductive oxide pattern TCOP is disposed on the first insulating layer 221. The transparent conductive oxide pattern TCOP may be formed through the same photolithography process as the first sensing electrode SE1, the electrode patterns SP2, and the second portion B2 described with reference to FIGS. 4A and 4B. The transparent conductive oxide pattern TCOP may include the same material as the first sensing electrode SE1, the electrode patterns SP2, and the second portion B2 and may have the same stacked structure as the first sensing electrode SE1, the electrode patterns SP2, and the second portion B2. Even though overlapping the sealing member SM, the transparent conductive oxide pattern TCOP may allow the laser beam to pass through.

As illustrated in FIGS. 6A and 6B, the transparent conductive oxide pattern TCOP may be connected to the signal line SL2 and the metal lines ML through contact holes 221-TH penetrating the first insulating layer 221. The contact hole 221-TH overlapping (i.e., exposing) the base portion SL10 may have a larger area than the contact hole 221-TH that overlaps (i.e., exposes) the first line portion SL11, the second line portion SL12, or the connecting portion SL13. The contact hole 221-TH overlapping the base portion SL10 does not overlap the sealing member SM. For example, the sealing member SM may not be exposed by the contact hole 221-TH overlapping the base portion SL10.

The metal lines ML may include a first metal line ML1 and a second metal line ML2 that cross each other to secure a contact area with a probe pin, which will be described below, and allow the laser beam to pass through as described above. The first metal line ML1 and the second metal line ML2 may extend in directions that cross the first direction DR1 and the second direction DR2. A plurality of first metal lines ML1 and a plurality of second metal lines ML2 may be provided. The metal lines ML may further include a third metal line ML3 extending in a direction that crosses the first metal line ML1 and the second metal line ML2.

The third metal line ML3 extends from an end of the first metal line ML1 to an end of the second metal line ML2 in the first direction DR1. The first metal line ML1, the second metal line ML2, and the third metal line ML3 may have a line width selected from a range of 1 micrometer to 10 micrometers. Even though the above-described metal lines ML overlap the sealing member SM, the above-described metal lines ML may provide a region through which the laser beam passes.

Referring to FIGS. 6A and 6C, an opening 221-OP (hereinafter, referred to as a first opening) is defined in the first insulating layer 221 to correspond to the metal lines ML, an opening TCOP-OP is defined in the transparent conductive oxide pattern TCOP to correspond to the metal lines ML, and an opening 222-OP1 (hereinafter, referred to as a second opening) is defined in the second insulating layer 222 to correspond to the metal lines ML. The metal lines ML are exposed to the outside through the openings 221-OP, TCOP-OP, and 222-OP1. In an embodiment, the first opening 221-OP and the second opening 222-OP are connected to each other to expose the metal lines ML.

An opening 222-OP2 (hereinafter, referred to as a third opening) is defined in the second insulating layer 222 to correspond to a portion of the transparent conductive oxide pattern TCOP. The portion of the transparent conductive oxide pattern TCOP is exposed to the outside through the third opening 222-OP2. Referring to FIG. 6A, the second opening 222-OP1 and the third opening 222-OP2 may be arranged in the second direction DR2 that is the extension direction of the transparent conductive oxide pattern TCOP.

A test region TA (refer to FIG. 8B) of the pad PD is defined to correspond to the second opening 222-OP1, and a bonding region BA (refer to FIG. 8B) of the pad PD is defined to correspond to the third opening 222-OP2. The test region TA of the pad PD is a region to which a probe pin to be described below is connected, and the bonding region BA of the pad PD is a region to which a pad of the flexible circuit board CF illustrated in FIG. 1B is electrically connected.

FIGS. 7A to 7E are sectional views illustrating a manufacturing method of the input sensor 220 according to an embodiment of the present disclosure. The manufacturing method of the input sensor 220 will be described based on FIG. 6C.

Figure 7A:
FIGS. 7A to 7E are sectional views illustrating a manufacturing method of the input sensor according to an embodiment of the present disclosure.

Referring to FIG. 7A, the metal lines ML (refer to FIG. 6A) are formed on the encapsulation substrate 210-U through a first photolithography process. Hereinafter, the first metal line ML1 among the metal lines ML will be described as an example. At this time, the second signal line SL2 of FIG. 6A may be simultaneously formed.

Figure 7B:
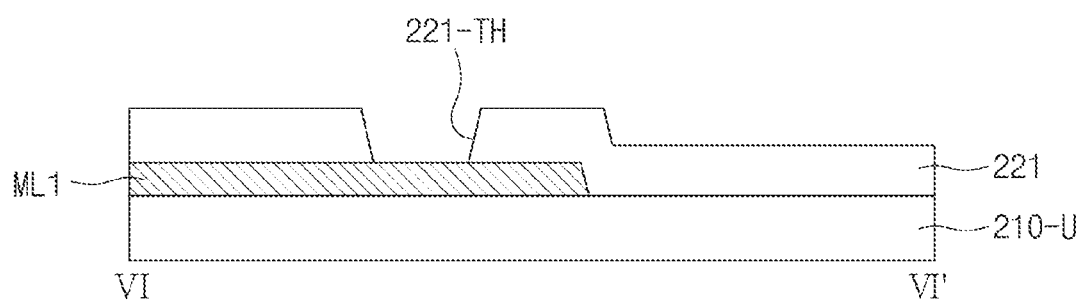

Referring to FIG. 7B, the first insulating layer 221 that covers the first metal line ML1 is formed on the encapsulation substrate 210-U. The first insulating layer 221 having the contact hole 221-TH defined therein through which the first metal line ML1 is exposed is formed through a second photolithography process.

Figure 7C:
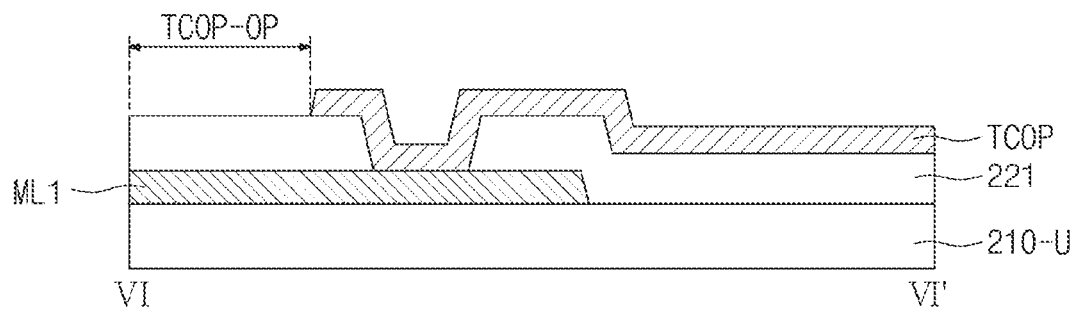

Referring to FIG. 7C, the transparent conductive oxide pattern TCOP is formed on the first insulating layer 221 through a third photolithography process. The transparent conductive oxide pattern TCOP having the opening TCOP-OP defined therein is formed from a transparent conductive oxide layer. At this time, the transparent conductive oxide pattern TCOP may be connected to the first metal line ML1 through the contact hole 221-TH. A wet etch process may be performed when the transparent conductive oxide layer is subjected to patterning in the third photolithography process, and the first metal line ML1 may be protected from an etchant of the wet etch process since the first insulating layer 221 covers the first metal line ML1.

Figure 7D:
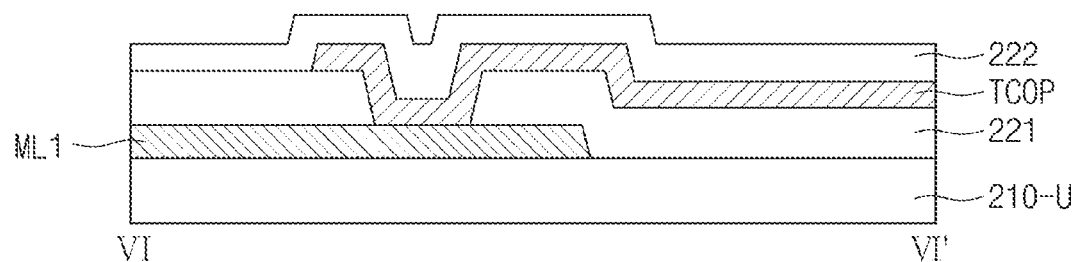
Figure 7E:
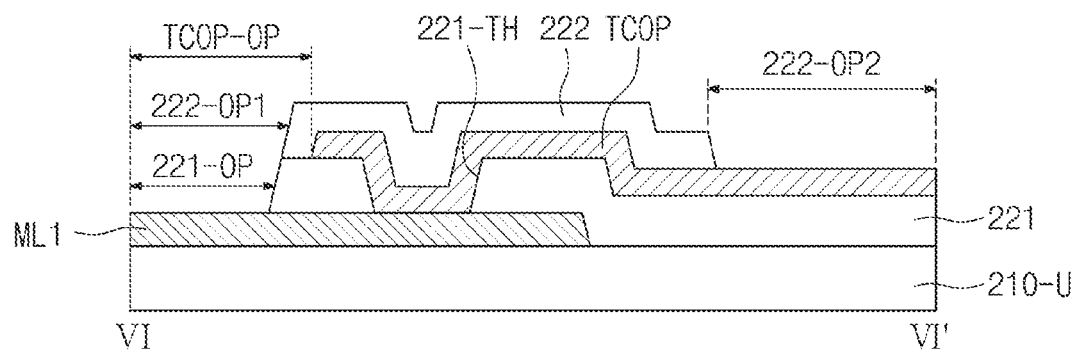

As illustrated in FIGS. 7D and 7E, the second insulating layer 222 having the second opening 222-OP1 and the third opening 222-OP2 formed therein is formed through a fourth photolithography process. First, as illustrated in FIG. 7D, the second insulating layer 222 is formed on the first insulating layer 221. The second insulating layer 222 may be formed through a deposition process. Next, the second opening 222-OP1 and the third opening 222-OP2 may be formed in the second insulating layer 222 through a photoresist layer forming process, an exposure process, a developing process, and an etching process.

The first opening 221-OP1 may be additionally formed when the second opening 222-OP1 is formed. The first opening 221-OP1 and the second opening 222-OP1 formed through the same photolithography process may be aligned with each other. That is, an edge of the first insulating layer 221 that defines the first opening 221-OP1 may be aligned with an edge of the second insulating layer 222 that defines the second opening 222-OP1. The edge of the first insulating layer 221 and the edge of the second insulating layer 222 may define the same inclined surface.

As illustrated in FIG. 6A, the first metal line ML1 formed through the above-described process may be electrically connected to the second signal line SL2 through the transparent conductive oxide pattern TCOP without being directly connected to the second signal line SL2. Even when the first metal line ML1 exposed to the outside is corroded, the transparent conductive oxide pattern TCOP may block the propagation of the corrosion such that the corrosion does not proceed to the second signal line SL2. This is because the transparent conductive oxide pattern TCOP has relatively low reactivity to moisture and oxygen.

Figure 8A:
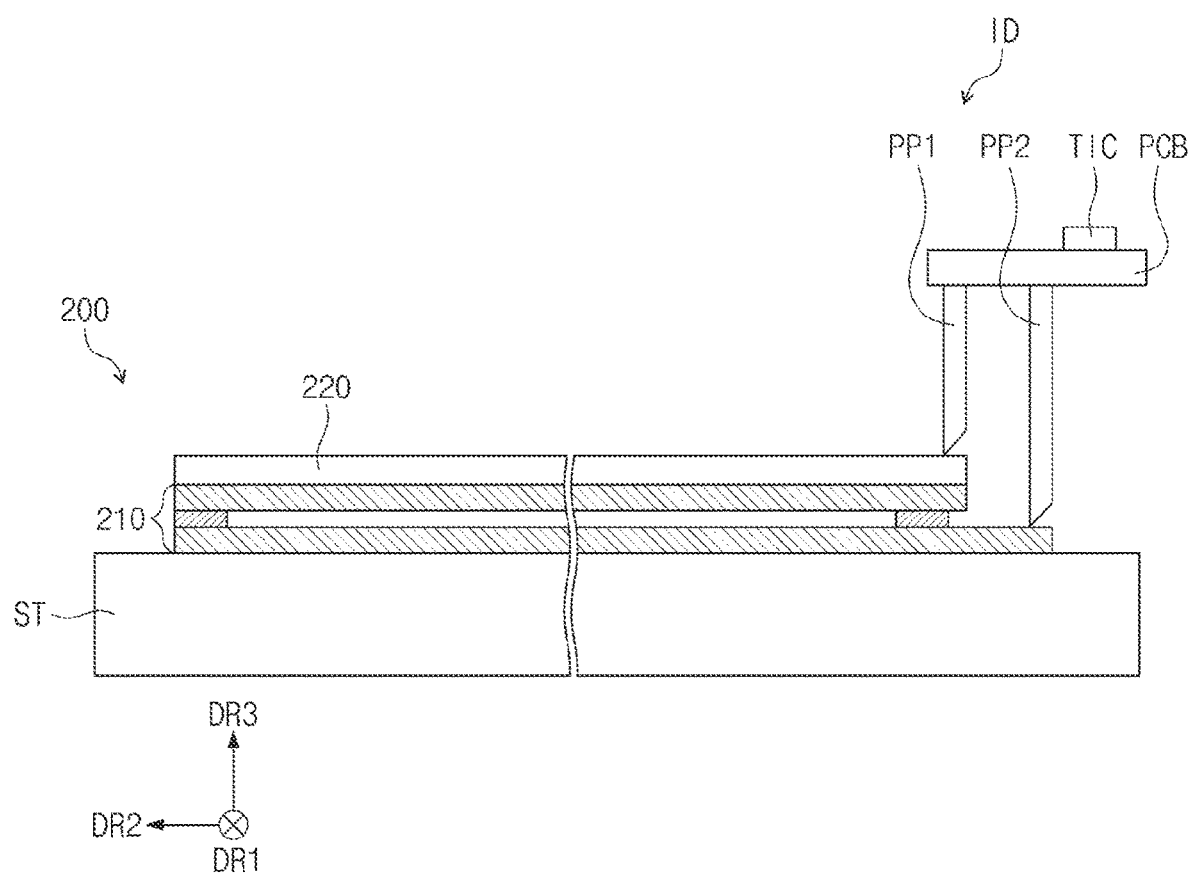
FIGS. 8A and 8B illustrate a test method of the input sensor according to an embodiment of the present disclosure.
Figure 8B:
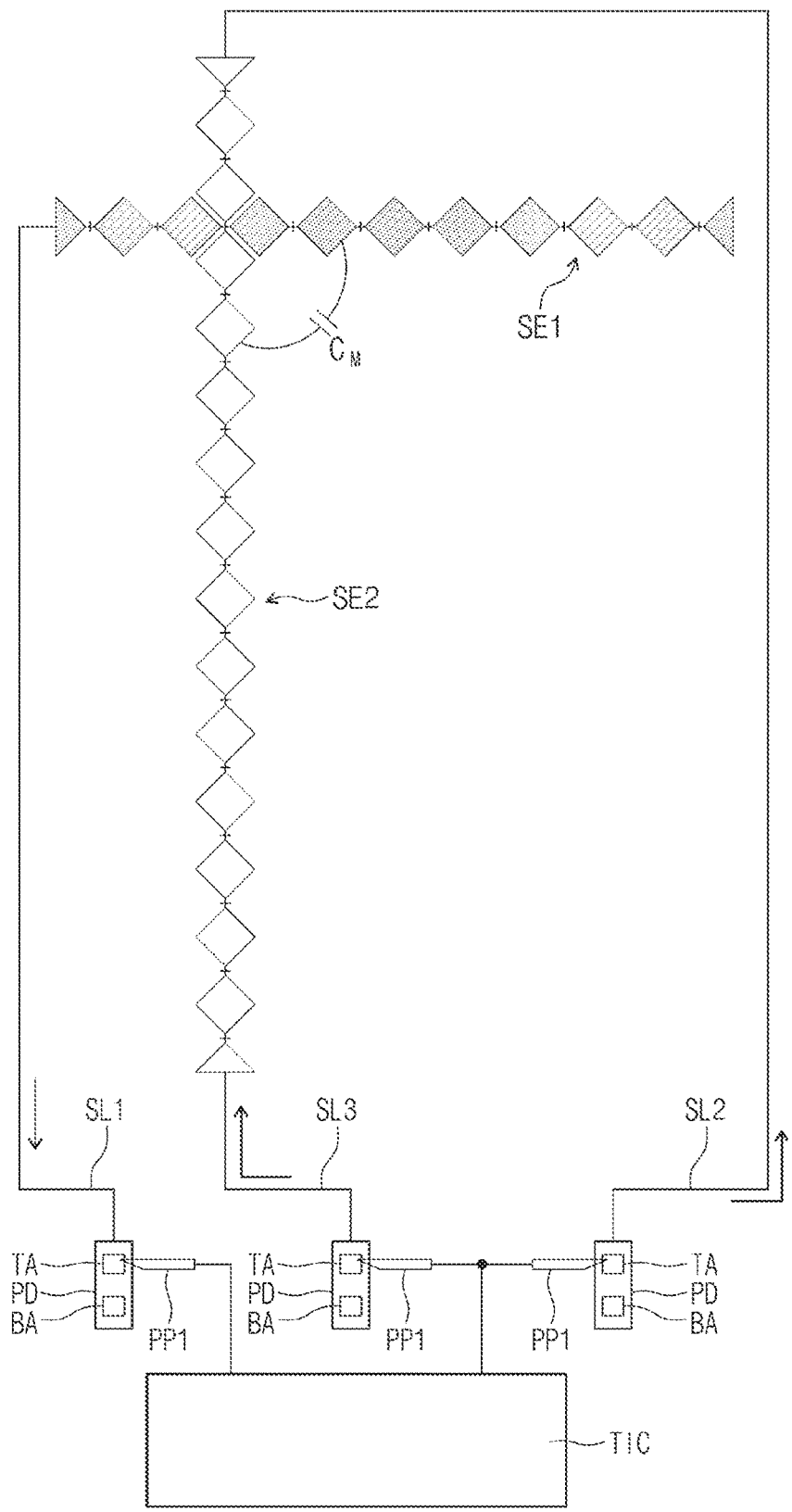

FIGS. 8A and 8B illustrate a test method of the input sensor 220 according to an embodiment of the present disclosure. The display device 2000 is disposed on a test stage ST. A test device ID is provided. The test device ID may include a module substantially the same as the circuit module FTC illustrated in FIG. 1C. The test device ID may drive the input sensor 220 in the same way that the circuit module FTC drives the input sensor 220.

The test device ID may include a circuit board PCB, a sensor drive circuit TIC mounted on the circuit board PCB, a first probe pin PP1, and a second probe pin PP2. A plurality of first probe pins PP1 may be provided to correspond to the pads PD of FIG. 3. The first probe pin PP1 electrically connects the circuit board PCB to the input sensor 220. The first probe pin PP1 may correspond to an anisotropic conductive film that electrically connects the flexible circuit board CF of FIG. 1C to the input sensor 220. The second probe pin PP2 electrically connects the circuit board PCB to the display panel 210. The second probe pin PP2 may connect the circuit board PCB to a ground of the display panel 210. The second probe pin PP2 may be omitted.

Referring to FIG. 8B, an electrical connection relationship of the first probe pins PP1 for one first sensing electrode SE1 and one second sensing electrode SE2 is briefly illustrated. The sensor drive circuit TIC may provide a drive signal to the second sensing electrode SE2 through the second signal line SL2 and the third signal line SL3. The drive signal may be a pulse signal. Mutual capacitance $C^M$ is defined between the first sensing electrode SE1 and the second sensing electrode SE2. The sensor drive circuit TIC detects the amount of change in the mutual capacitance $C_M$ through the first signal line SL1.

The first probe pins PP1 are connected to test regions TA of the pads PD. The test regions TA may be regions corresponding to the second opening 222-OP1 described with reference to FIGS. 6A and 6C and may correspond to the metal lines ML described with reference to FIGS. 6A and 6C. Bonding regions BA illustrated in FIG. 8B may be regions corresponding to the third opening 222-OP3 described with reference to FIGS. 6A and 6C and may correspond to portions of the transparent conductive oxide pattern TCOP described with reference to FIGS. 6A and 6C.

The first probe pins PP1 are connected to the metal lines ML exposed through the openings 221-OP, TCOP-OP, and 222-OP of FIGS. 6A and 6C. Contact resistance between the first probe pins PP1 and the transparent conductive oxide pattern TCOP may be greater than contact resistance between the first probe pins PP1 and the metal lines ML, and a large variation in the contact resistance between the first probe pins PP1 and the transparent conductive oxide pattern TCOP may occur. This is because scratches are generated when the first probe pins PP1 make contact with the transparent conductive oxide pattern TCOP and the degree to which the scratches are generated varies depending on contacts between the probe pins and the transparent conductive oxide pattern TCOP. In contrast, the metal lines ML having low contact resistance may achieve sufficient electrical connection through only contact of the first probe pins PP1.

Referring to FIG. 8B, the drive signal is simultaneously provided to the second signal line SL2 and the third signal line SL3. The drive signal is sequentially provided to the plurality of second signal lines SL2 and the plurality of third signal lines SL3 illustrated in FIG. 3.

The sensor drive circuit TIC detects the amount of change in the mutual capacitance $C_M$ through the first signal line SL1. The sensor drive circuit TIC detects the amount of change in the mutual capacitance $C_M$ through each of the plurality of first signal lines SL1 illustrated in FIG. 3. The test device ID may test whether the input sensor 220 normally operates, by comparing the amounts of changes in the mutual capacitances $C_M$ detected for the plurality of first signal lines SL1, respectively.

Although the above description has been made based on the second signal line SL2 of the input sensor 220 and the pad PD connected thereto, the present disclosure is not necessarily limited thereto. A signal line and a pad that are the same as the second signal line SL2 and the pad PD connected thereto may be applied to an electronic panel or sensor rather than the input sensor 220.

FIGS. 9A to 9D are plan views of signal lines SL2 and pads PD connected thereto according to embodiments of the present disclosure. Hereinafter, detailed description about the same configuration will refer to FIGS. 6A to 6C.

Figure 9A:
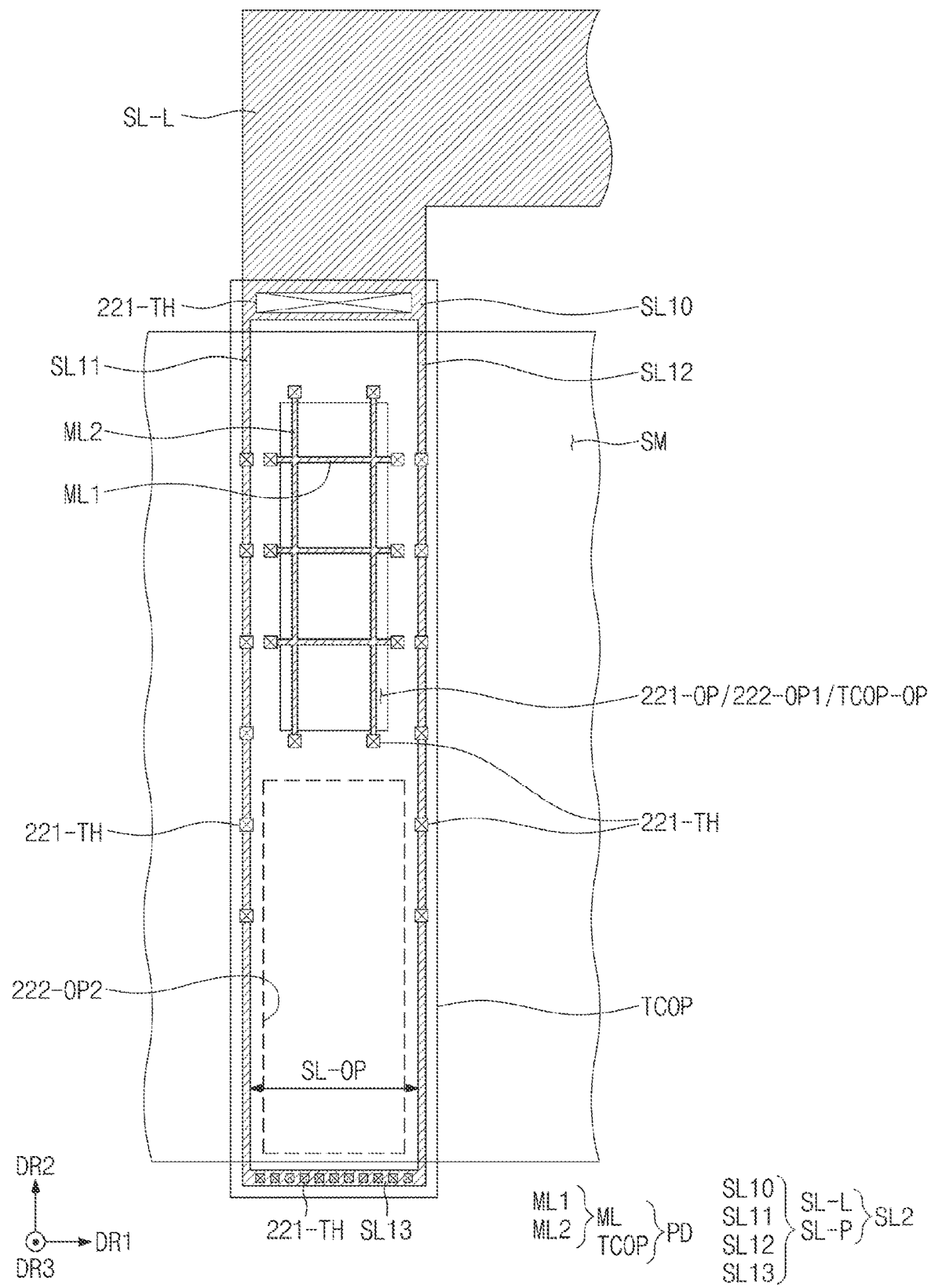
FIGS. 9A to 9D are plan views of signal lines and pads connected thereto according to embodiments of the present disclosure.

Referring to FIG. 9A, metal lines ML may include first metal lines ML1 extending in the first direction DR1 and second metal lines ML2 extending in the second direction DR2. The first metal lines ML1 and the second metal lines ML2 crossing each other may secure a region through which a laser beam passes.

Figure 9B:
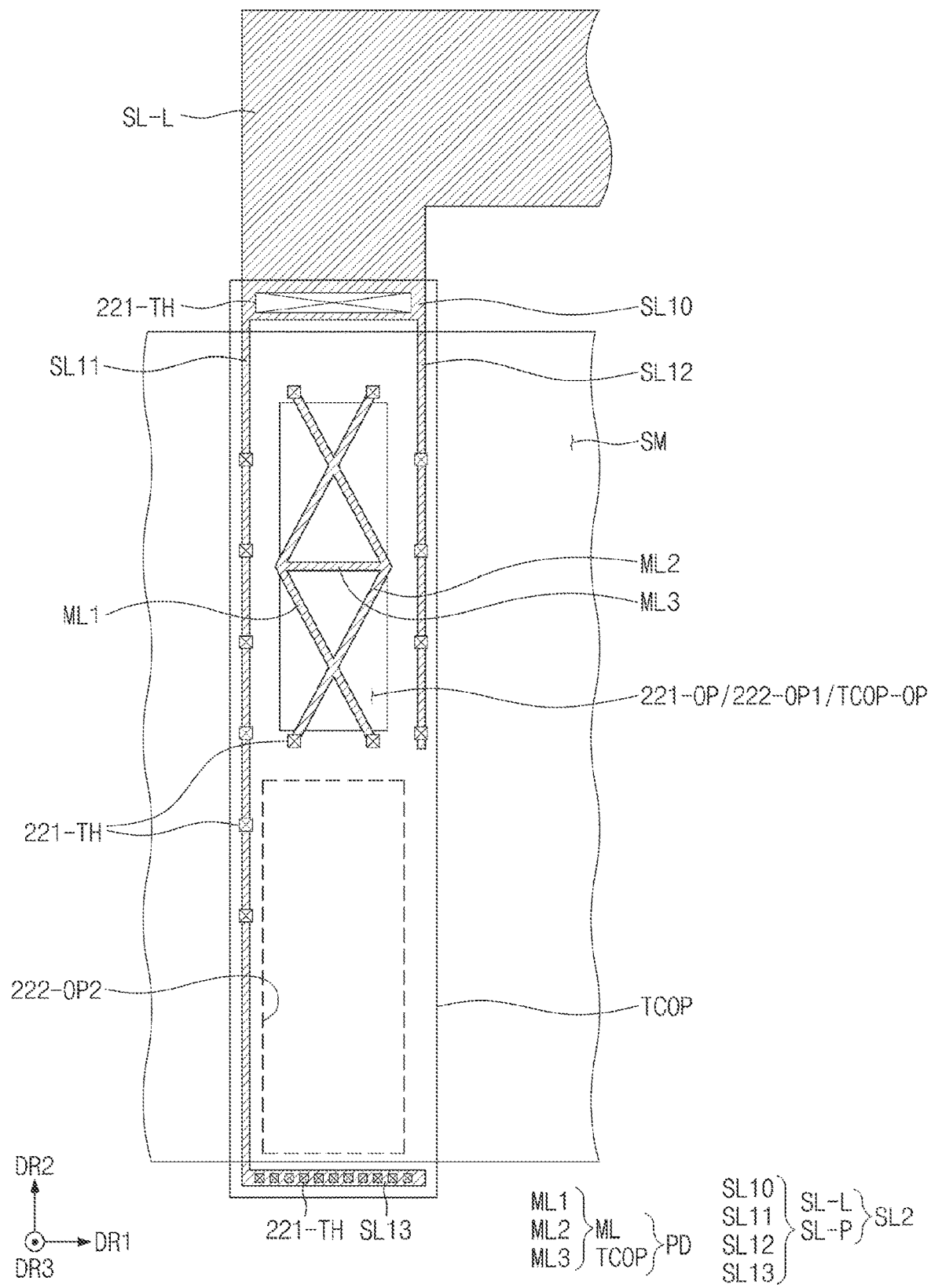

Referring to FIG. 9B, a second line portion SL12 may be shorter than a first line portion SL11. A region through which a laser beam passes may be sufficiently secured even though the opening SL-OP of FIG. 6A is not defined.

Figure 9C:
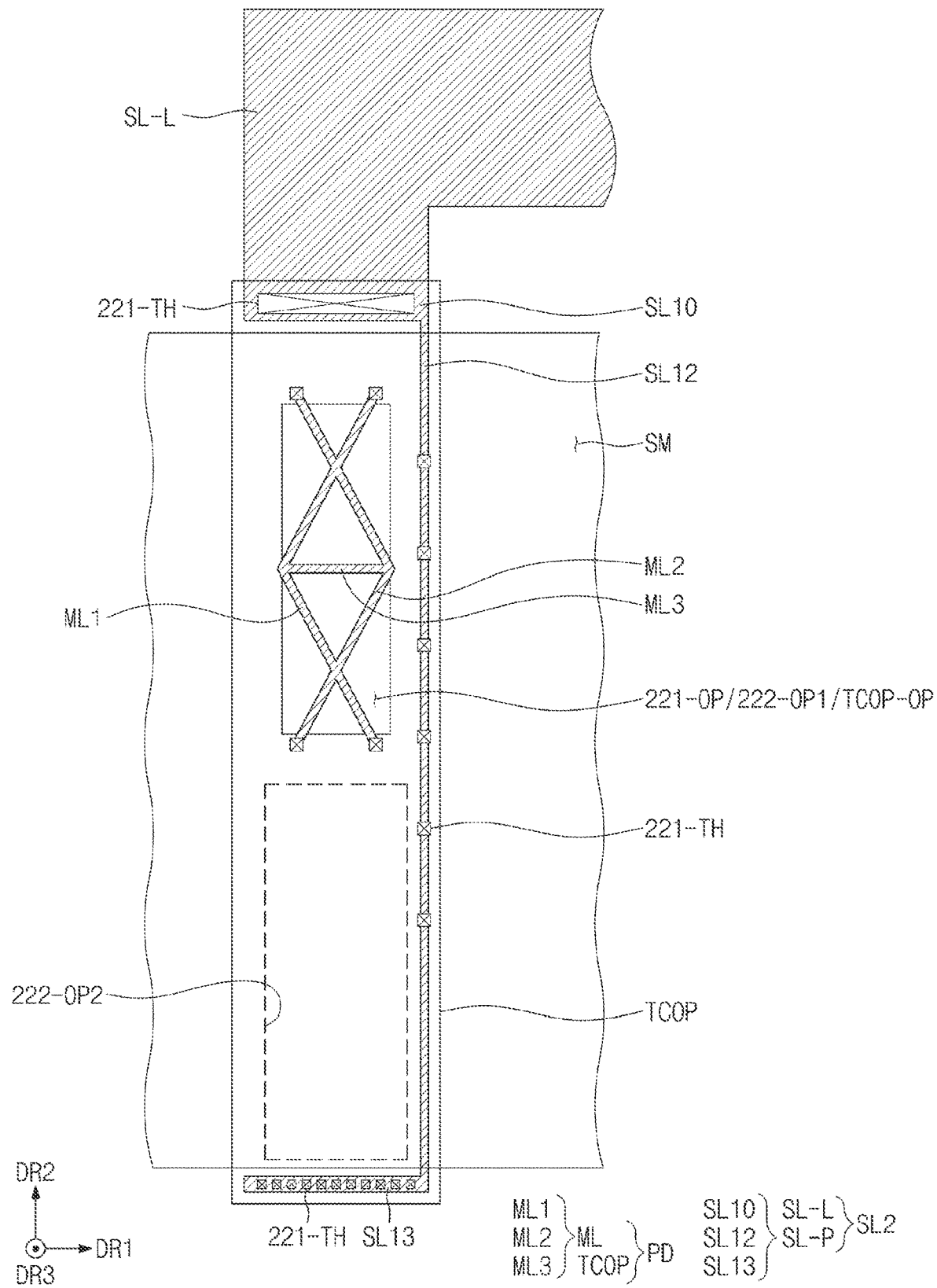

Referring to FIG. 9C, a pad portion SL-P may include a base portion SL10, a second line portion SL12, and a connecting portion SL13. A region through which a laser beam passes may be sufficiently secured even though the first line portion SL11 of FIG. 6A is omitted and the opening SL-OP of FIG. 6A is not defined.

Figure 9D:
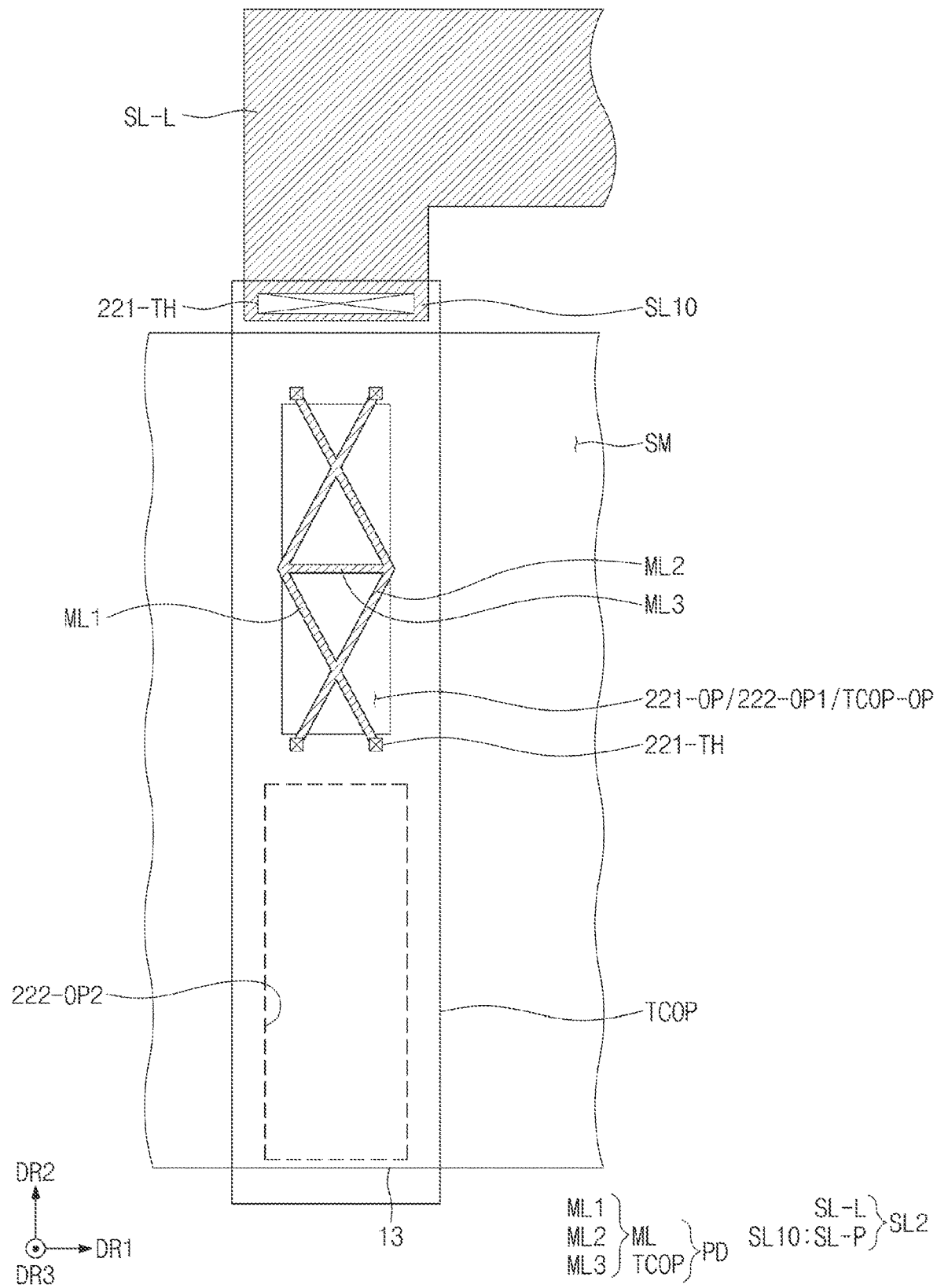

Referring to FIG. 9D, a pad portion SL-P may include a base portion SL10. A region through which a laser beam passes may be sufficiently secured as the first line portion SL11, the second line portion SL12, and the connecting portion SL13 of FIG. 6A are not disposed. In an embodiment, the first line portion SL11, the second line portion SL12, and the connecting portion SL13 are configured such that a laser beam may pass through a region in which the first line portion SL11, the second line portion SL12, and the connecting portion SL13 are disposed.

As described above, the sealing member may be cured by applying a laser beam from above the pad region of the input sensor during the manufacturing process of the display device. The signal line and the pad may allow the laser beam to pass through and may prevent a defect of the manufacturing process that the laser beam is reflected from the signal line or the pad.

The probes of the test device may be connected to the metal lines with low contact resistance. A contact resistance deviation between the pads and the probes of the test device may be reduced. Accordingly, the test reliability of the input sensor may be improved.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
   a display panel including a display substrate, an encapsulation substrate facing the display substrate, and a sealing member coupling the display substrate and the encapsulation substrate with each other; and
   an input sensor disposed on the display panel,
   wherein the input sensor includes:
   a sensing electrode;
   a signal line connected to the sensing electrode;

a pad connected to the signal line; and
an insulating layer,
wherein the pad includes:
    metal lines disposed on the same layer as the signal line and spaced apart from the signal line on a plane; and
    a transparent conductive oxide pattern disposed on the signal line and the metal lines and electrically connected to the signal line and the metal lines, and
wherein the transparent conductive oxide pattern includes an opening exposing the metal lines.

2. The display device of claim 1,
wherein the signal line includes the same material as the metal lines.

3. The display device of claim 1,
wherein the metal lines include a first metal line and a second metal line crossing the first metal line.

4. The display device of claim 3,
wherein the metal lines further include a third metal line connected to the first metal line and the second metal line.

5. The display device of claim 1,
wherein the metal lines have a line width selected from a range of 1 micrometer to 10 micrometers.

6. The display device of claim 1,
wherein the signal line includes a pad portion overlapping the transparent conductive oxide pattern, and
wherein the pad portion has a pad opening exposing the metal lines.

7. The display device of claim 1,
wherein the signal line includes a pad portion overlapping the transparent conductive oxide pattern,
wherein the pad portion includes a base portion, and a first line portion and a second line portion extending from the base portion, and
wherein the metal lines are disposed in a space between the first line portion and the second line portion.

8. The display device of claim 7,
wherein the first line portion has a line width selected from a range of 1 micrometer to 10 micrometers.

9. The display device of claim 7,
wherein the first line portion and the second line portion have the same length.

10. The display device of claim 1,
wherein the metal lines overlap the sealing member.

11. The display device of claim 1,
wherein the transparent conductive oxide pattern overlaps the sealing member.

12. The display device of claim 1,
wherein the insulating layer includes a first insulating layer disposed on the signal line, and
wherein the first insulating layer includes a first opening disposed under the opening of the transparent conductive oxide pattern.

13. The display device of claim 12,
wherein the transparent conductive oxide pattern is disposed on the first insulating layer, and
wherein the transparent conductive oxide pattern is connected to the signal line through a first contact hole penetrating the first insulating layer and is connected to the metal lines through a second contact hole penetrating the first insulating layer.

14. The display device of claim 12,
wherein the insulating layer further includes a second insulting layer disposed on the first insulating layer, and
wherein the second insulating layer has a second opening and a third opening defined therein,
wherein the second opening is connected to the first opening, and
wherein the third opening exposes a portion of the transparent conductive oxide pattern.

15. The display device of claim 14,
wherein the first opening and the second opening are aligned with each other.

16. The display device of claim 14,
wherein the second opening and the third opening are arranged in an extension direction of the transparent conductive oxide pattern.

17. The display device of claim 1,
wherein the sensing electrode includes a first sensing electrode extended in a first direction and a second sensing electrode extended in a second direction crossing the first direction, and
wherein one of the first sensing electrode and the second sensing electrode includes an electrode pattern disposed on a layer different from the signal line and a conductive pattern disposed on the same layer as the signal line and connected to the electrode pattern.

18. The display device of claim 17,
wherein the other one of the first sensing electrode and the second sensing electrode includes the same material as the transparent conductive oxide pattern and is disposed on the same layer as the transparent conductive oxide pattern.

19. A display device comprising:
a display panel including a lower glass substrate, an upper glass substrate, and a frit coupling the lower glass substrate to the upper glass substrate; and
an input sensor disposed on an upper surface of the upper glass substrate,
wherein the input sensor includes:
    a sensing electrode;
    a signal line connected to the sensing electrode; and
    a pad connected to the signal line,
wherein the pad includes:
    a metal line disposed on the same layer as the signal line and spaced apart from the signal line on a plane, the metal line overlapping the frit; and
    a transparent conductive oxide pattern disposed on the signal line and the metal line and electrically connected to the signal line and the metal line,
the transparent conductive oxide pattern overlapping the frit, and
wherein the transparent conductive oxide pattern includes an opening exposing the metal line.

20. A display device comprising:
a base substrate;
a signal line disposed on the base substrate;
an insulating layer covering the signal line; and
a pad connected to the signal line,
wherein the pad includes:
    a metal pattern disposed on the same layer as the signal line and spaced apart from the signal line on a plane; and
    a transparent conductive oxide pattern disposed on the insulating layer and electrically connected to the signal line and the metal pattern through contact holes penetrating the insulating layer,
wherein the transparent conductive oxide pattern includes a first opening exposing the metal pattern,
wherein the insulating layer includes a second opening exposing the metal pattern,
wherein the first opening is greater than the second opening, and wherein a portion of the insulating layer partially fills the first opening and contacts an inner surface of the first opening.

* * * * *